United States Patent [19]
Bingham

[11] Patent Number: 4,812,891
[45] Date of Patent: Mar. 14, 1989

[54] BIPOLAR LATERAL PASS-TRANSISTOR FOR CMOS CIRCUITS

[75] Inventor: David Bingham, San Jose, Calif.

[73] Assignee: Maxim Integrated Products, Sunnyvale, Calif.

[21] Appl. No.: 133,958

[22] Filed: Dec. 17, 1987

[51] Int. Cl.[4] .................... H01L 29/72; H01L 27/02; H03K 3/26
[52] U.S. Cl. ........................ 357/35; 357/36; 357/43; 307/303
[58] Field of Search .................. 357/35, 36, 43; 307/296.2, 296.4, 296.6, 446, 475, 570

[56] References Cited

U.S. PATENT DOCUMENTS

| | | | |
|---|---|---|---|
| 3,703,650 | 11/1972 | Kendall | 357/43 |
| 3,878,551 | 4/1975 | Callahan, Jr. | 357/35 |
| 4,581,547 | 4/1986 | Bynum et al. | 357/35 |
| 4,642,667 | 2/1987 | Magee | 357/43 |
| 4,697,199 | 9/1987 | De Graaff et al. | 357/43 |
| 4,701,646 | 10/1987 | Richardson | 307/475 |

FOREIGN PATENT DOCUMENTS

8100924  4/1981  PCT Int'l Appl. .................... 357/35

*Primary Examiner*—Eugene R. LaRoche
*Assistant Examiner*—Michael Shingleton
*Attorney, Agent, or Firm*—Blakely, Sokoloff, Taylor & Zafman

[57] ABSTRACT

A bipolar lateral pass-transistor is disclosed for use in MOS integrated circuits. The transistor includes a semiconductor substrate of a first conductivity type covered by an epitaxial layer, a first region of a second conductivity type disposed in the epitaxial layer at a first doping level to a depth of less than the depth of said epitaxial layer, a second region of said conductivity type spaced apart from and surrounding said first region and extending approximately the entire depth of said epitaxial layer having a doping level less than the first doping level and a third region of said second conductivity type spaced apart from and surrounding said second region and extending approximately the entire depth of said epitaxial layer having said first doping level at the surface of said epitaxial layer and said second doping level extending approximately to the bottom of said epitaxial layer.

In another aspect of the present invention the bipolar lateral pass-transistor is connected to a voltage source and MOS devices also disposed on the surface of the semiconductor substrate are powered by a voltage which is less than the voltage applied to the lateral pass-transistor, in order to prevent desirable forward biasing of parasitic PN junctions.

6 Claims, 5 Drawing Sheets

BIPOLAR LATERAL PASS-TRANSISTOR FOR CMOS CIRCUITS

BACKGROUND OF THE INVENTION

1. Field of the Invention

The present invention pertains to semiconductor structures and fabrication techniques. More particularly, the present invention pertains to the integration of bipolar technology structures into CMOS circuits utilizing CMOS processing technology. The present invention is a bipolar lateral pass-transistor for use in CMOS integrated circuit ("IC") applications and a process for fabricating it. The bipolar transistor structure of the present invention has a high immunity to latch-up and has improved high frequency characteristics.

2. The Prior Art

Junction isolated CMOS technologies are increasingly being used for analog and analog/digital integrated circuits. One of the limitations to date has been the implementation of a low on-resistance switch for sourcing high currents from a positive supply. A low on-resistance MOS P-channel transistor, for example, occupies a large silicon area compared to a conventional bipolar PNP transistor. The difference in silicon area can be up to ten times larger depending on a variety of considerations, including gate drive voltage, gate oxide thickness etc., resulting in higher manufacturing costs and less efficient use of silicon chip area.

There is a group of common circuit functions such as low dropout linear voltage regulators/battery backup circuits, which require one low on-resistance switch coupled with a multiplicity of additional circuitry, such as error amplifiers, voltage references and logic. The use of bipolar transistor technology for configuring such low on-resistance switches has decided advantages, not the least of which is the reduction of silicon area. The integration of such bipolar technology with MOS technology, however, raises several well-known problems. The most well-known of these problems is the familiar latch-up which occurs when the PN junctions inherent in such a structure become forward biased.

One bipolar transistor for use in MOS technologies would be of the lateral type wherein the collector and emitter are P-type diffusions in an N-type substrate which is used as the base. This type of PNP transistor is commonly called a lateral PNP transistor due to the fact that the average collector to emitter current flows in a lateral direction parallel to the surface of the silicon.

It has been customary to avoid this bipolar structure in CMOS circuit structures because of the inherent latch-up problem and the limitation on its usefulness because its base is at the same potential a the substrate of the integrated circuit. If the emitter of such a PNP transistor is connected to the positive supply of the IC, collector current will be undefined and virtually uncontrolled, and minority carriers, injected into the base, will be collected by the collector and the other P regions comprising the drain and source of P channel transistors and the P-wells or substrate of the N channel transistors for a P-well CMOS technology. If a sufficient amount of this injected current is collected by the P-well devices then the well-known phenomena of latch-up may occur.

As the use of CMOS circuitry increases, the number and variations of circuits will also increase. Because of considerations, such as size, already mentioned, it would be useful to incorporate such a lateral PNP transistor into existing CMOS designs. Therefore, there is a need for a structure and technique for creating a lateral PNP transistor having as its base region the substrate of the integrated circuit, which avoids the latch-up and other problems encountered by currently-known technology.

Another problem which is encountered when trying to integrate a lateral PNP transistor into a CMOS structure relates to the frequency characteristics of the device. Because of the random paths that minority carriers generated by the base may take, the mean lifetime of the minority carriers is relatively long. This phenomenon degrades high frequency characteristics of the device.

BRIEF DESCRIPTION OF THE INVENTION

The present invention is a lateral bipolar transistor which may be incorporated into CMOS structures using a process which does not require any processing steps foreign to CMOS technology. While the present disclosure is related to a P-well technology and discloses a lateral PNP transistor, it equally applies to N-well technologies and NPN bipolar transistors by reversing the polarities and types of transistors.

The PNP lateral pass-transistor of the present invention is constructed on an N+ substrate having an N− epitaxial layer grown thereon. A P+ region forms the emitter of the transistor. This P+ region is spaced from and surrounded by a P+ collector region. Under the P+ collector region there is an additional P− region, which extends approximately to the bottom of the epitaxial layer and which may be formed at the same time that the P-wells are formed. In a preferred embodiment of the present invention, there is an additional serial collector region spaced apart from the first collector region made of P+ diffusion. Like the other collector, the P+ region has underlying it a P− region which extends approximately to the bottom of the epitaxial layer. This diffusion is preferably also formed at the same time the P-wells are formed.

The PNP transistor of the present invention can be fabricated using conventional CMOS technology steps. The starting material is an N+ substrate with an N− epitaxial layer grown thereon. The P− region under the collector regions may be formed at the same time that the P-wells are formed in the CMOS structure, thereby avoiding extra processing steps. The P+ regions forming the emitter region and collector regions of the transistor may be formed at the same time that the source and drain diffusions are formed for the other MOS devices on the wafer.

BRIEF DESCRIPTION OF THE DRAWINGS

FIG. 2b is the equivalent schematic diagram of the diode connected N-channel transistor of FIG. 2a.

FIG. 5a is a cross-section of a lateral bipolar PNP transistor according to the present invention in combination of a diode-connected N-channel transistor and a CMOS inverter, showing an illustrative embodiment of the manner in which the lateral bipolar PNP transistor may be used to avoid forward biasing junctions.

FIG. 5b is the equivalent schematic diagram of the circuit of FIG. 5a.

DETAILED DESCRIPTION OF A PREFERRED EMBODIMENT

Figure 1A:
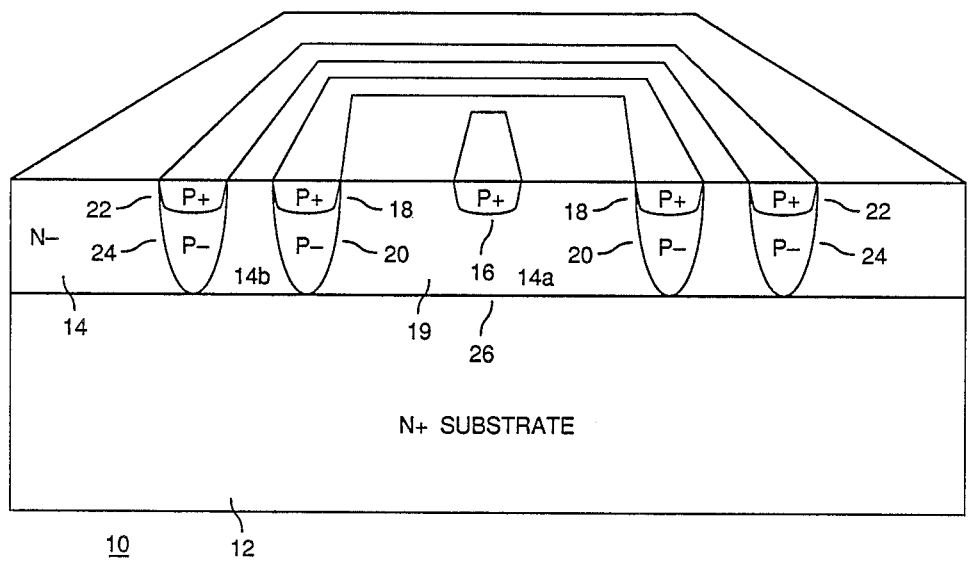
FIG. 1a is a cross-section of the structure of a PNP lateral pass-transistor fabricated according to the present invention.

Referring first to FIG. 1a, a cross-sectional view of the structure of a preferred embodiment of the present invention, the PNP lateral pass-transistor 10 is constructed on an N+ substrate 12 having an N− epitaxial layer 14 grown thereon. Portions 14a and 14b of epitaxial layer 14 will be discussed specifically. P+ emitter region 16 and P+ collector region 18 are diffused into the surface of the epitaxial layer 14. P− region 20, underlying P+ collector region 18, extends the entire depth of epitaxial layer 14. Region 20 is preferably diffused into the substrate at the same time that the P-wells for the CMOS circuitry are diffused.

P+ serial collector 22 is also diffused into the surface of N− epitaxial region 14. P− region 24, underlying serial collector P+ region 22 may also be diffused into the substrate at the time that the P-wells are being formed. Epitaxial layer 14 acts as the base of the transistor.

The above-described structure minimizes the mean-free path of minority carriers before collection by the collector. The doping density gradient interface 26 between N+ substrate 12 and N− epitaxial layer 14 forms a barrier which reflects minority carriers. Thus, many minority carriers injected into the base region of the transistor from P+ emitter 16 are reflected off of this interface 26. In addition, as can be seen from FIG. 1a, P− region 20 will collect all minority carriers that have not recombined thus preventing them from diffusing out of the bounded region of the base 19 to other regions. The effect of the encircling collector and N+ substrate is to restrain the minority carriers injected into the base region 14a by forward biasing of the base-emitter junction of the PNP transistor.

The collector, employing a P− region capped with a P+ region, which also improves ohmic contact and decreases series resistance, encircles the emitter. The P− diffusion is tailored to touch the N+ substrate region. Thus most minority carriers will be collected by the collector with a small number recombining. Because the mean-free path of a minority carrier between the emitter and the collector is much smaller than would otherwise be the case, the current gain and high frequency response is much enhanced over a similar PNP transistor without the structure of the present invention.

In such a structure, there is a possibility of saturating the PNP transistor whereby the collector-base voltage approaches the emitter-base voltage. When this occurs, the collector base region becomes forward biased and again holes are injected into the N− region at 14b. These too must be collected so that they cannot reach the rest of the circuit. A second, or serial collector 22, surrounding the first collector achieves this objective.

Figure 1B:
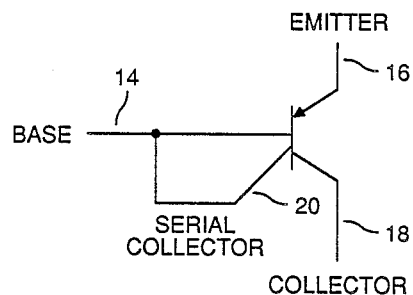
FIG. 1b is the equivalent schematic diagram of the PNP lateral pass-transistor of the present invention.

FIG. 1b shows a schematic representation of the lateral PNP pass-transistor of the present invention. Emitter 16, collector 18, and serial collector 20 are comprised of diffused areas in the substrate. The base 14 of the lateral PNP pass-transistor is the substrate of the IC semiconductor device.

In another aspect of the present invention, the PNP lateral pass-transistor may be used in practical configurations with other circuitry. Because this transistor has its base connected to the substrate, all P regions, P-wells, sources and drains of all the P-channel transistors and other subcomponents using P− type regions, are intimately connected to the base of this transistor and to the capacitively coupled PN space charged regions, on the assumption of these regions be reversed biased. In order to prevent forward biasing of any of these regions, they cannot be biased more positively than the N− epitaxial layer by more than about 300 mV. The terminal connected to these P regions will be referred to as V+.

The problem with junction isolated CMOS is that a PN or schotty diode cannot be integrated without causing further carrier injection into the substrate or requiring extra manufacturing process steps. The diode can be used externally but would add cost and additional connections to the IC.

The only practically-integratable component that approximates an equivalent diode is a diode-connected N-channel transistor. Shown in FIGS. 2a and 2b, this has a turn on voltage equal to its threshold voltage (usually between 0.5 and 1.0 volts) and for low to medium forward currents is reasonably equivalent to a PN diode. Since this component obeys a square law relationship between drain current and gate source voltage instead of the exponential characteristic of the PN diode, its forward voltage drop as a function of forward voltage is less steep.

Figure 2A:
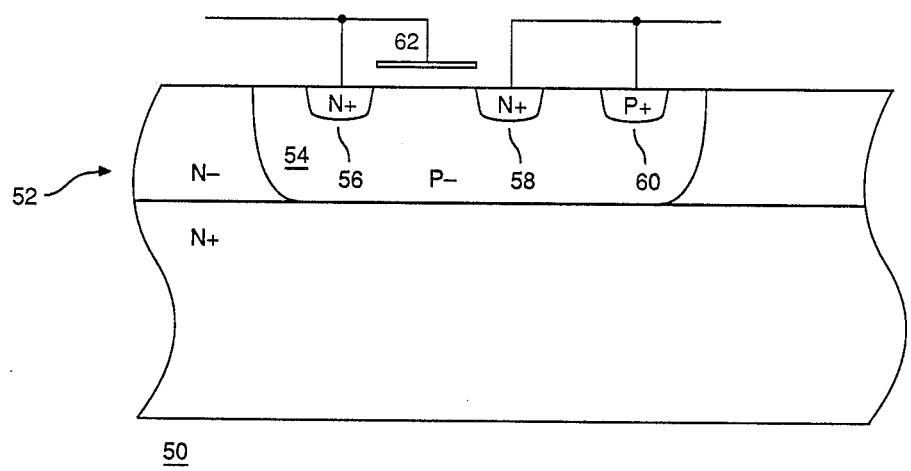
FIG. 2a is a cross section of the diode-connected N-channel transistor, showing circuit connections.
Figure 2B:
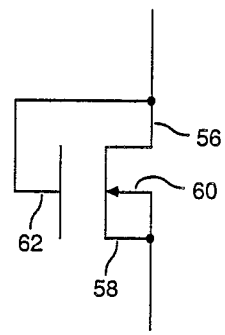

From FIG. 2a it can be seen that N+ substrate 50 having epitaxial layer 52 grown thereon contains P-well 54. P-well 54 contains N+ regions 56 and 58 as well as P+ region 60. N+ regions 56 and 58 serve as the drain and source respectively of the N-channel transistor. P+ region 60 serves as a connection point for the substrate connection of the N-channel transistor. Gate region 62 shown overlying the channel between N+ regions 56 and 58 is connected to drain region 56. Source region 58 is shown connected together to P-region 60. The diode-connected N-channel device is shown schematically in FIG. 2b.

An alternative to the diode equivalent is to place a resistor in parallel with the base-emitter junction of the PNP transistor, such that the current through the resistor does not produce a voltage across the resistor sufficient to turn on the PNP transistor. To turn on the PNP transistor, an additional current is supplied to the base of that transistor and this resistor to produce the desired base-emitter turn on voltage.

Figure 3A:
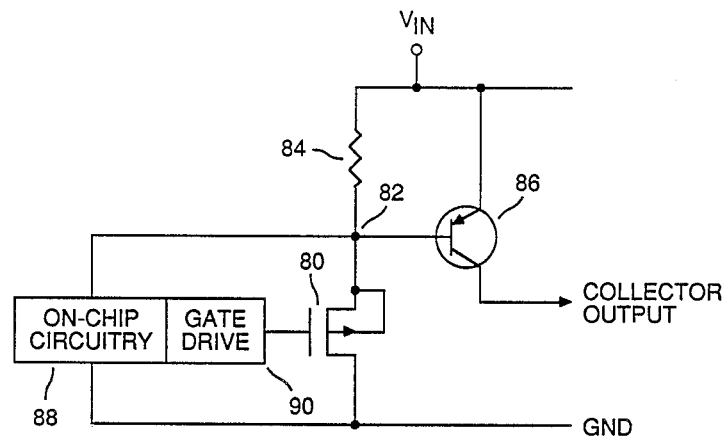
FIG. 3a illustrates an alternative way to turn on the lateral bipolar transistor which assures prevention of forward biasing of the other PN junctions of the CMOS circuitry, using a P-channel device.
Figure 3B:
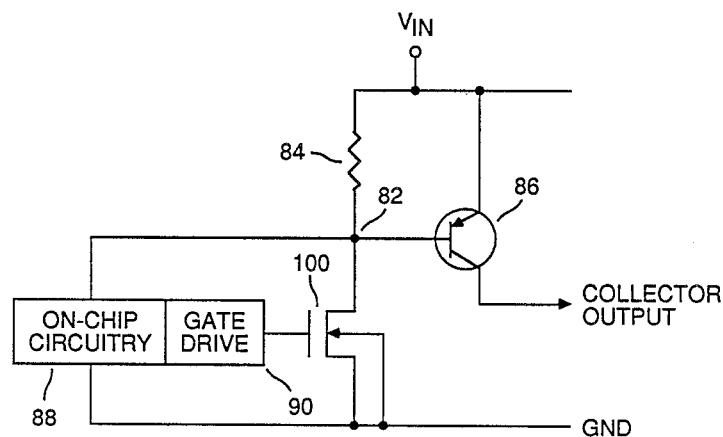
FIG. 3b illustrates an alternative way to turn on the lateral bipolar transistor which assures prevention of forward biasing of the other PN junctions of the CMOS circuitry, using a N-channel device.

FIGS. 3a and 3b show two ways to produce this additional current. In FIG. 3a, a P-channel transistor 80 is used as a source follower. P-channel transistor 80 has its drain connected to ground, its source connected to node 82, which is the common connection between resistor 84 and the base of PNP transistor 86. On-chip circuitry 88, shown schematically by block 88 is connected between ground and node 82. On-chip circuitry 88 may contain any number of elements and will differ, obviously, depending on the function of the chip. A gate-drive circuit, shown in block diagram form at 90, is located within on-chip circuitry 88. It may consist of, for instance an amplifier, or any other circuitry known to those of ordinary skill in the art which will effect the function of driving the gate of P-channel transistor 80 when it is desired to turn on PNP transistor 86.

When P-channel transistor 80 is turned on, additional current flows through resistor 84, thus providing the additional voltage across resistor 84 to turn on PNP transistor 86. In FIG. 3b, an N-channel transistor 100 is shown supplying current into a node 82 consisting of the base of the PNP transistor 86 and the resistor 84. N-channel transistor 100 has its source connected to ground and its drain connected to node 82. Node 82 is the junction of resistor 84 and the base of PNP transistor 86. The gate of N-channel transistor 100 is connected to gate-drive circuitry 90 located as part of on-chip circuitry 88, just as in the embodiment of FIG. 3a. Just as in the embodiment of the FIG. 3a, activation of gate-drive circuitry 90 will turn on N-channel transistor 100 thus increasing the voltage across resistor 84 and turning on PNP transistor 86.

The two examples shown in FIGS. 3a and 3b are given to demonstrate ways of controlling the PNP collector current only and are not intended to represent all circuit means to achieve the same objectives. When either P-channel transistor 80 or N-channel transistor 100 is off, the current drain of on-chip circuitry 88 is the determining factor for establishment of the voltage across resistor 84. Thus, the value of resistor 84 should be selected with this current drain in mind to establish a voltage below the turn on voltage for PNP transistor 86. It is desireable that the voltage drop across this resistor should be approximately 0.3 volts, so that the source of the P-channel transistors will not become forward biased with respect to the N-substrate.

Figure 4:
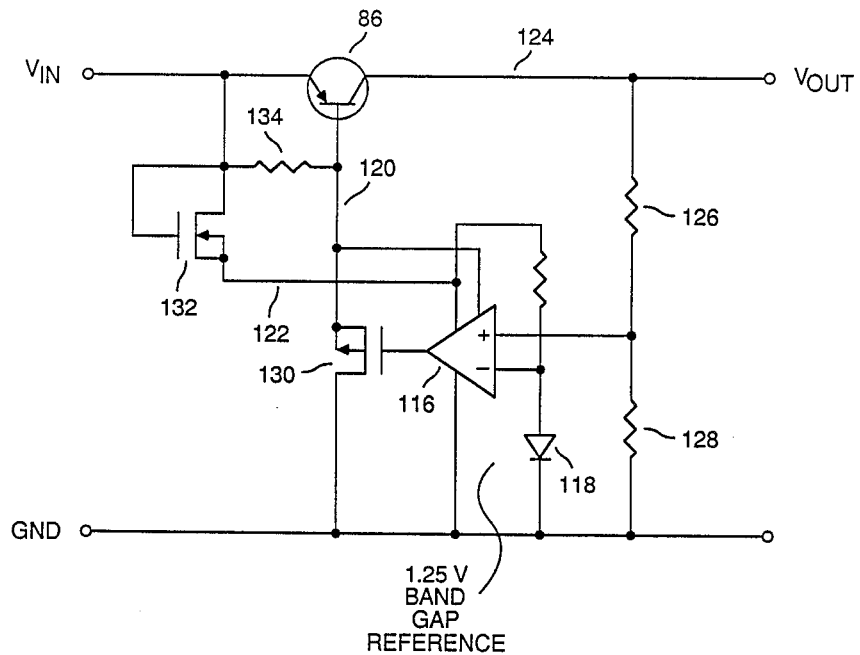
FIG. 4 illustrates a practical circuit configuration utilizing the present invention.

Referring now to FIG. 4, a practical circuit representation of a positive linear series regulator using the PNP transistor 86 as the high current pass element is shown. In this circuit, the error amplifier 116 and the band gap reference diode 118 contain a variety of N and P channel transistors, resistors, capacitors, etc. which are not shown in detail. All of the P-channel transistors should have their substrates connected to line 120 which is also the base of the PNP transistor. The source of the P-channel transistor 132 is are connected to line 122. The error amplifier 116 compares a fraction of the output voltage on line 124 (via a voltage divider comprising resistors 126 and 128) with the output of band gap reference diode 118 and drives the gate of a source follower P-channel transistor 130 which in turn drives the base of PNP transistor 86. If $V_{out}$ is low, the output of error amplifier 116 is also low, which, in turn, alters the base current of PNP transistor 86 and therefore raises the value of $V_{out}$. N-channel transistor 132 is connected in the diode configuration as previously disclosed. Resistor 134 is present to control the base current of PNP transistor 86 when P-channel transistor 130 is turned off.

Figures 5A, 5B:
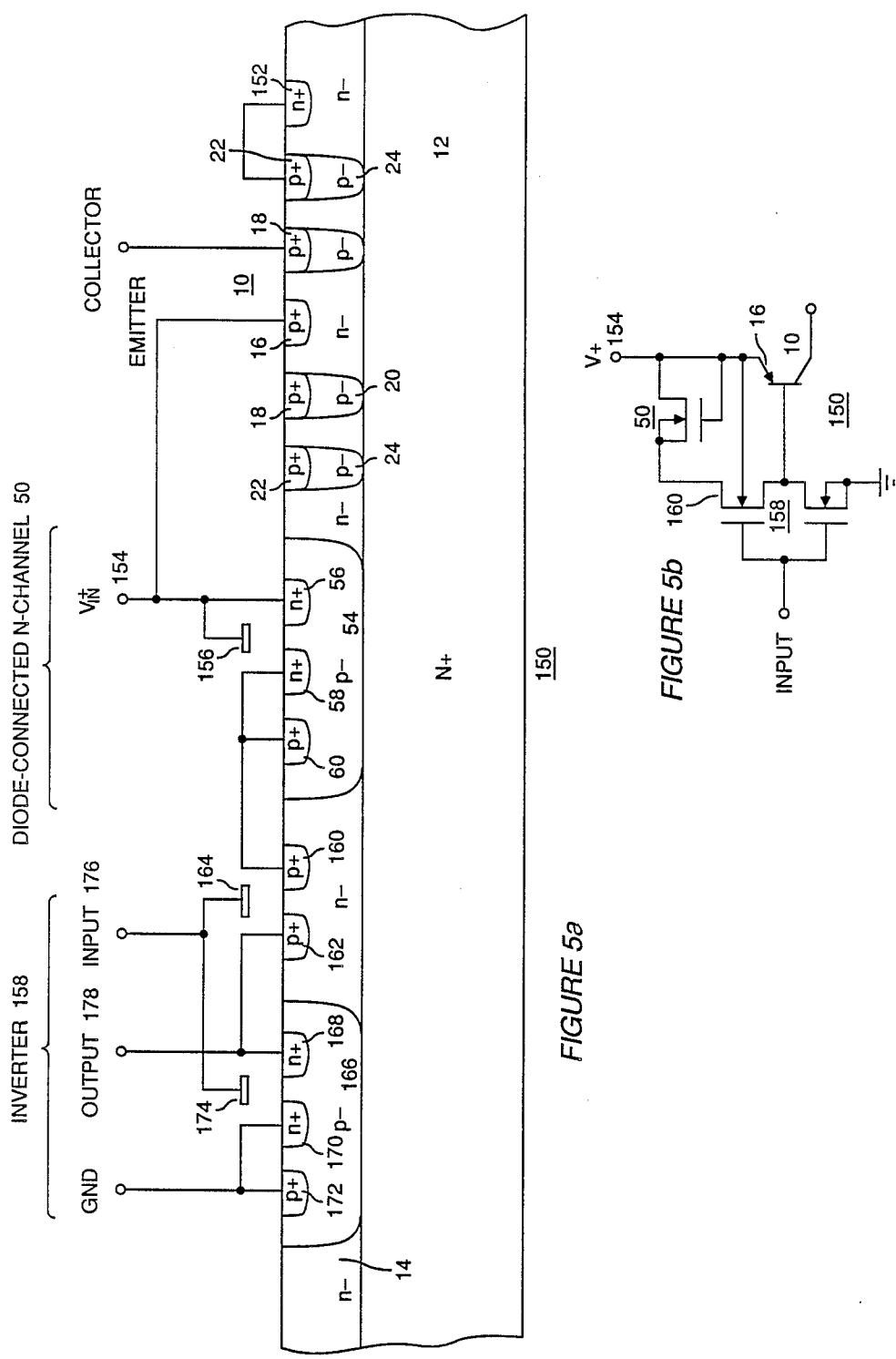

Referring now to FIG. 5a, a cross-sectional view of a lateral PNP pass-transistor according to the present invention in combination with a CMOS inverter and a diode-connected N-channel transistor is shown.

This circuit, collectively referred to by reference numeral 150, is constructed on an N+ substrate 12 having an N− epitaxial layer 14 grown thereon.

The lateral bipolar PNP transistor 10 has P+ region 16 as its emitter, and P+ region 18 as its collector. P− region 20 extends from the bottom of P+ region 18 to approximately the depth of epitaxial layer 14. As is shown in FIG. 5a, the collector 18 of lateral PNP transistor 10 is spaced apart from and completely surrounds base region 16. A serial collector 22 is spaced apart from and completely surrounds collector 18. Like collector 18, serial collector 22, comprising a P+ region, has a P− region 24 underlying it. P− region 24 extends from the bottom of P region 22 to approximately the depth of epitaxial layer 14. N+ region 152 is used to connect serial collector 22 to the epitaxial layer 14, as indicated schematically in FIG. 1b. A source of positive voltage, shown at reference numeral 154, is connected to P+ emitter region 16.

A diode-connected N-channel transistor 50, shown immediately to the left of the lateral bipolar PNP transistor 10 in FIG. 5a, includes a P-well 54, containing N+ regions 56 and 58, and P+ region 60. N+ regions 56 and 58 serve as the drain and source, respectively, of the diode-connected N-channel transistor 50. P+ region 60 serves as a connection point for the substrate connection of the N-channel transistor, as previously shown schematically in FIG. 2b. In FIG. 5a, the drain region 56 of the diode-connected N-channel transistor 50 is shown connected to positive voltage source 154. Its gate region 156 is also shown connected to positive voltage source 154.

Immediately to the left of the diode connected N-channel device 50 on FIG. 5a is a commonly-employed two-transistor CMOS inverter circuit 158 consisting of a P-channel device having a P+ source region 160 and P+ drain region 162 in epitaxial layer 14. P+region 160 is connected to P+ region 60 and N+ region 58 of the diode-connected N-channel transistor 50. Gate 164 is disposed above and insulated from the channel between regions 160 and 162.

The N-channel device portion of the inverter is constructed in P-well 166, including N+ diffusion regions 168 and 170, along with P+ region 172. N+ region 168 is the drain of the N-channel device, N+ region 170 is the source of the N-channel device. P+ region 172 is a connection point for connecting N+ source region 170 to the substrate of the device, P-well 166. Gate 174 of the N-channel device, disposed above and insulated from the channel between N+ regions 168 and 170, is connected to the gate 164 of the P-channel device. This connection forms input 176 of the inverter. The output of the inverter, at reference numeral 178 is the common connection between P+ region 162 and N+ region 168. This connection is the common connection between the drain 168 of the N-channel drive transistor and the drain 162 of the P-channel device of the inverter 158.

In FIG. 5b, a schematic diagram of the circuit 150 depicted in FIG. 5a is shown. Lateral PNP transistor 10 is shown connected to diode-connected N-channel transistor 50 and inverter 158. The same reference numerals are used in FIGS. 5a and 5b to facilitate understanding of the figures.

As can be seen from FIG. 5b, lateral PNP transistor 10 has its emitter 16 connected to the source of highest positive voltage V+ at 154. All of the other CMOS circuitry on the chip, represented by inverter circuit 158, has its most positive connection, i.e., source region 160 of the P-channel device of the inverter of FIGS. 5a and 5b, connected to the other end of diode-connected N-channel device 50, a threshold drop below the voltage at positive voltage source 154. Thus, there can be no forward biased PN junctions in the semiconductor device which could cause runaway current conditions or latch-up.

As is apparent from disclosure and accompanying figures, the circuitry of the present invention may be fabricated using conventional CMOS techniques. The physical circuit layout used in any particular design incorporating the present invention will be dictated by good layout design practice in general, and considerations related to the actual circuit in particular.

Although an embodiment is disclosed utilizing P-well technology and a PNP bipolar transistor, an embodiment of the present invention may be constructed using N-well technology and NPN bipolar transistors. It is intended that such embodiments also fall within the scope of the present invention, which is limited only by the scope of the appended claims.

What is claimed is:

1. A bipolar lateral pass-transistor for use in MOS integrated circuits, including
    a semiconductor substrate having a substantially uniform doping of a first conductivity type,
    an epitaxial layer on the surface of said substrate having a substantially uniform doping of said first conductivity type in a concentration lower than that of said substrate,
    a first region of a second conductivity type, disposed in said epitaxial layer, having a first doping level, the depth of said region being less than the depth of said epitaxial layer,
    a second region of said second conductivity type, spaced apart from and surrounding said first region and extending approximately the entire depth of said epitaxial layer, said second region having said first doping level at the surface of said epitaxial layer, and having a second doping level at a concentration substantially less then said first doping level, extending substantially through said epitaxial layer, and
    a third region of said second conductivity type, spaced apart from and surrounding said second region and extending substantially through said epitaxial layer, having said doping level at the surface of said epitaxial layer, and having a second doping level at a concentration less then said first doping level, extending to the bottom of said epitaxial layer, said epitaxial layer exterior to said third region being capable of supporting MOS transistors without additional isolation.

2. The bipolar lateral pass-transistor of claim 1, wherein said first conductivity type is N and said second conductivity type is P.

3. The bipolar lateral pass-transistor of claim 1, wherein said first conductivity type is N and said second conductivity type is N.

4. The bipolar lateral pass-transistor of claim 1, further including:
    additional regions of said second conductivity type disposed in said epitaxial layer said regions comprising sources and drains of MOS devices, and
    means for preventing forward-biasing of said additional regions with respect to said semiconductor substrate.

5. The bipolar lateral pass-transistor of claim 4, wherein said means for preventing forward biasing includes a diode-connected MOS transistor interposed between said first region and the diffusion region or regions in the surface of said epitaxial layer which form the drain or source terminals of additional CMOS circuitry integrated with said bipolar lateral pass-transistor to which the highest positive voltage is connected.

6. An electrical circuit, including:
    a semiconductor substrate having a substantially uniform doping of a first conductivity type,
    an epitaxial layer on the surface of said substrate having a substantially uniform doping of said first conductivity type in a concentration lower then that of said substrate,
    a first region of a second conductivity type, disposed in said epitaxial layer, having a first doping level, the depth of said region being less than the depth of said epitaxial layer,
    a second region of said second conductivity type, spaced apart from and surrounding said first region and extending approximately the entire depth of said epitaxial layer, said second region having said first doping level at the surface of said epitaxial layer, and having a second doping level at a concentration substantially less then said first doping level, extending substantially through said epitaxial layer, and
    a third region of said second conductivity type, spaced apart from and surrounding said second region and extending substantially through said epitaxial layer, having said first doping level at the surface of said epitaxial layer, and having a second doping level at a concentration less then said first doping level, extending to the bottom of said epitaxial layer, said epitaxial layer exterior to said third region being capable of supporting MOS transistors without additional isolation;
    a well of said second conductivity type, disposed in said epitaxial layer, spaced apart from said third region, and having said second doping level,
    a pair of spaced apart diffusions of said first conductivity type having a doping level higher than that of said epitaxial layer,
    a region of said second conductivity type in said well having a doping concentration higher than that of said well electrically connected to the first one of said diffusions in said well, an electrical connection between said first region and said second one of said diffusions in said well, a gate, electrically insulated from the surface of said epitaxial layer, and disposed above said first and second diffusions in said well, said gate being electrically connected to said first region.

* * * * *

UNITED STATES PATENT AND TRADEMARK OFFICE
CERTIFICATE OF CORRECTION

PATENT NO. : 4,812,891
DATED : 3/14/89
INVENTOR(S) : Bingham

It is certified that error in the above-identified patent and that said Letters Patent is hereby corrected as shown below:

| | | |
|---|---|---|
| col. 01, line 54 | delete "a" | insert --as-- |
| col. 04, line 24 | delete "schotty" | insert --Schottky-- |
| col. 05, line 47 | delete "are" | |
| col. 06, line 11 | delete "P" | insert --P+-- |
| col. 07, line 45 | after "said" | insert --first-- |
| col. 07, line 58 | delete "N" | insert --P-- |

Signed and Sealed this

Twenty-seventh Day of August, 1991

Attest:

HARRY F. MANBECK, JR.

*Attesting Officer*          *Commissioner of Patents and Trademarks*